United States Patent [19]

Ward

[11] 3,764,955

[45] Oct. 9, 1973

[54] CONNECTING AND MOUNTING MEANS FOR SUBSTRATES

[75] Inventor: John Ambrose Ward, Carlisle, Pa.

[73] Assignee: AMP Incorporated, Harrisburg, Pa.

[22] Filed: May 17, 1972

[21] Appl. No.: 254,196

[52] U.S. Cl. .......... 339/65, 339/176 MP, 339/220 R

[51] Int. Cl. .......................... H05k 1/07, H01r 13/62

[58] Field of Search ....................... 339/17 L, 17 LC, 339/17 LM, 176 MP, 218, 220, 258 R, 65; 29/629

[56] References Cited

UNITED STATES PATENTS

| | | | |
|---|---|---|---|
| 3,601,775 | 8/1971 | Longenecker | 339/176 MP |
| 3,567,998 | 3/1971 | Ammerman | 339/17 L X |
| 3,479,634 | 11/1969 | Pritulsky | 339/176 MP X |
| 1,984,036 | 12/1934 | Schwartzman | 339/218 M |

FOREIGN PATENTS OR APPLICATIONS

| | | | |
|---|---|---|---|
| 1,089,838 | 9/1960 | Germany | 339/176 MP |
| 205,341 | 10/1923 | Great Britain | 339/220 R |

*Primary Examiner*—Marvin A. Champion
*Assistant Examiner*—Lawrence J. Staab
*Attorney*—William J. Keating et al.

[57] ABSTRACT

Connecting and mounting means for substrates comprises an elongated mounting bar having connecting devices mounted therein at spaced intervals. The connecting devices have aligned spring receptacles which receive and support the substrate and have posts which are adapted to enter holes in a printed circuit board.

3 Claims, 7 Drawing Figures

CONNECTING AND MOUNTING MEANS FOR SUBSTRATES

BACKGROUND OF THE INVENTION

This invention relates to mounting and connecting means for mounting substrates on printed circuit boards and connecting the terminal pads of the substrate to the conductors of the board.

It is common practice to mount solid state devices, such as integrated circuit devices, on insulating plates, commonly referred to as substrates. Conductors in the form of metalisized lines are provided on the substrate to provide electrical circuitry for connecting the integrated circuit devices to external circuitry.

The electrical connections and the mounting means for these substrates are commonly provided by bonding or welding leads to the terminal pads of the substrate and connecting the ends of the leads to the conductors on a printed circuit board. Alternatively, it has been suggested that connecting means in the form of a housing having terminals therein can be used, these connecting devices being adapted to receive the substrate in a manner such that the terminals in the connecting devices will be in electrical contact with the terminal pads of the substrate.

These prior art methods of forming electrical connections with substrates are satisfactory for many circumstances but there remains a need for a low cost connecting and supporting device which does not require welding or bonding to the substrate terminal pads. The increasing usage of solid state electronic devices gives rise to this requirement of simplified low cost connecting and mounting means for such devices.

It is accordingly an object of the invention to provide an improved mounting and connecting means for mounting substrates on printed circuit boards and forming electrical connections with the terminal pads of the substrate. A further object is to provide a mounting and connecting means which does not require bonding to the terminal pads of the substrate. A further object is to provide a mounting and connecting means which is of relatively simple construction and which can be manufactured at a low cost. A further object is to provide a mounting and connecting means which occupies a minimum amount of space and which can be assembled to the substrate and to the printed circuit board in a short time.

These and other objects of the invention are achieved in a preferred embodiment thereof which is briefly described in the foregoing abstract, which is described in detail below, and which is shown in the accompanying drawing in which.

Figures 1, 2, 3:
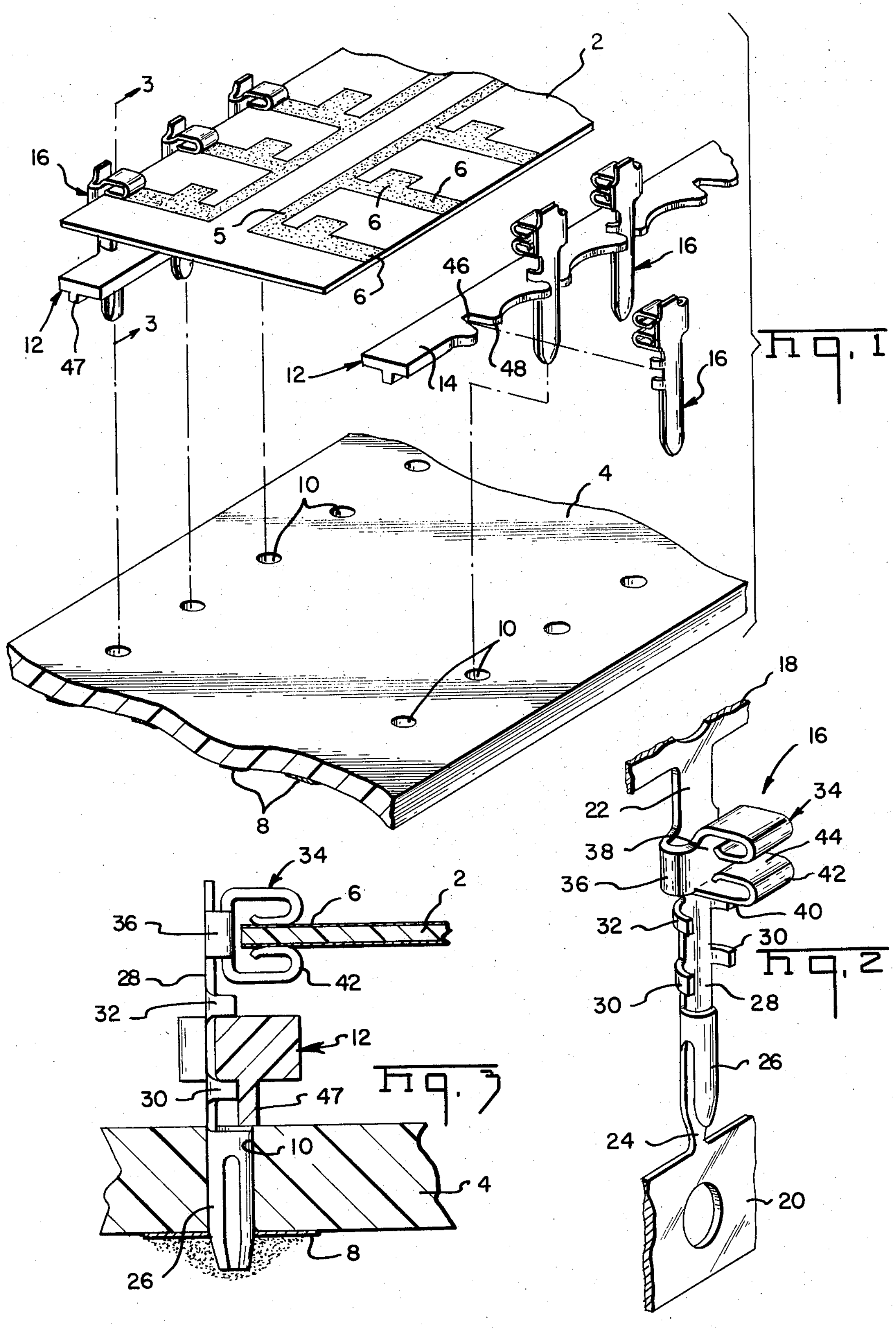
FIG. 1 is a perspective, partially exploded view of a portion of a printed circuit board and a substrate, this view illustrating the relationship of a connecting and supporting means in accordance with the invention to the printed circuit board and the substrate.
FIG. 2 is a perspective view of a metallic connecting device of a type used in the connecting and mounting means of FIG. 1.
FIG. 3 is a sectional view taken along the lines of 3—3 of FIG. 2 but with the parts assembled to each other.

Referring first to FIG. 1–3, a substrate 2 on which a solid state device (not specifically shown) is mounted has conductors 5 on its upper surface which extend from the solid state device to terminal pads 6 located along the sides of the substrate. In a typical assembly, these pads are electrically connected to conductors 8 on the underside of a printed circuit board 4 on which the substrate 2 is mounted. Holes 10 are provided in the board to provide access to the conductors 8 and to receive post portions of connecting devices as described below.

The mounting and connecting means 12 of this embodiment comprises an elongated mounting bar 14 of a suitable insulating material such as a glass filled nylon. A plurality of metallic connecting device 16 are mounted in the mounting bar at spaced-apart locations corresponding to the location of the terminal pads 6 on the substrate 2. These connecting devices are advantageously manufactured from strip stock metal as a continuous strip, FIG. 2, having upper and lower carrier strips 18, 20 with the individual connecting devices extending between these carrier strips and integral with the carrier strips as shown at 22, 24. Each connecting device has a generally cylindrical post portion 26 at its lower end and has a flat or slightly curved shank 28 extending upperwardly from this post portion. Two pairs of ears 30, 32 are provided on the shank 28 to facilitate assembly of the connecting device to the mounting bar. A spring receptacle 34 is provided on the upper end of the shank 28 and is connected to the shank by a laterally extending reversely bent connecting neck section 36. The end of this neck section forms a flat web 38 from the sides of which contact ears extend, these ears being reversely bent at 42 to provide a pair of spaced apart contact surfaces 44.

The mounting bar 14 has spaced apart notches 46 on one edge thereof and has a thickness of which is substantially equal to the spacing between the ears 30, 32 of the connecting device 16. The connecting devices are assembled to the mounting bar 14 by simply locating them in the notches 46 with the edges of the ears 30, 32 bearing against the sides of the bar 14. Projecting portions 48 on each side of each notch 46 are then deformed by a heading process until the individual connecting devices are securely locked to the strip of bar 14.

In use, two of the mounting and supporting means 12 are assembled to the substrate 2 as shown in FIG. 1 with a connecting device 16 in electrical contact with each of the pads 6. The entire assembly is then moved downwardly, as viewed in FIG. 1, until the post portions 26 extend through the printed circuit board holes 10. The posts can then be soldered to conductors 8 as shown in FIG. 3. It is desirable to provide projections 47 at each end of the mounting bar in order to support this bar above the surface of the printed circuit board as shown in FIG. 3.

The connecting device 16 can be of any suitable material such as a 70-30 brass, a suitable beryllium copper, or a stainless steel. The configuration of the spring receptacle 34 is such that the contact pressure developed can be closely controlled during manufacture by control of the thickness of the strip metal and/or its spring characteristics. Since two opposed contact surfaces 44 are provided, a connecting device 16 is capable of contacting either side of the substrate 2 and the substrate can therefore be either face up or face down on the printed circuit board.

FIG. 4–7 shows an alternative form of the invention which is adapted to support a substrate 52 in a plane which extends normally of the plane of the printed circuit board 53. This alternative embodiment comprises an elongated mounting bar 54 of glass filled nylon or other suitable material having integral flanges 56 on its ends, these flanges having grooves 58 for reception of the edges of the substrate 52. The conductors 60 of the substrate extend to the lower edge thereof and are electrically contacted by metallic connecting devices 62 of the type shown in FIG. 5.

Each connecting device has a cylindrical portion 64, a shank 66, and spaced apart pairs 68, 70 of ears as previously described with reference of the embodiment of FIG. 2. The spring receptacle of this embodiment is in the form of a reversibly bent extension 72 of the shank 66. This extension extends parallel at 74 to the shank and is formed into a circular spring 76 which is reversibly formed at its end 78. Either the curved section 78 of the flat section 74 can function as contact a surface as will be described below. Connecting devices of the type shown at 62 are advantageously manufactured of the same materials as the previously described embodiment.

The mounting bar 54 has outwardly facing recesses 80 at spaced intervals on its side edges and the individual connecting devices are secured in the recesses as previously described. The outwardly directed attitudes of the ears prevents contacting between adjacent connecting devices and the staggered arrangement of the connecting devices permits close spacing of these devices in the mounting bar.

Figures 4, 5, 6, 7:
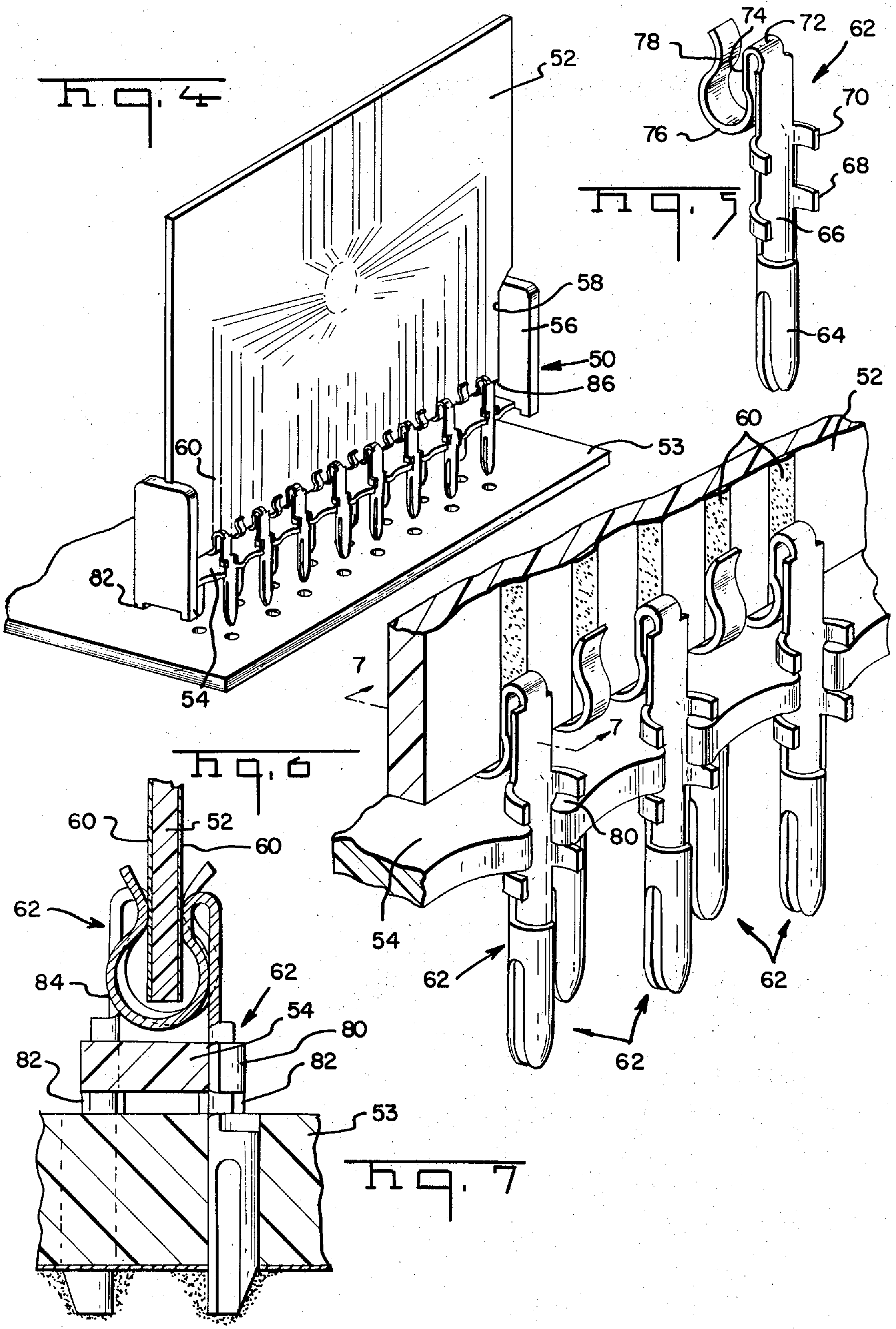
FIG. 4 is a perspective exploded view illustrating the use of a connecting and mounting means in accordance with an alternative embodiment of the invention.
FIG. 5 is a perspective view of a metallic connecting device used in a connecting and mounting means of the type shown in FIG. 4.
FIG. 6 is a fragmentary perspective view showing the manner in which the connecting devices are secured to the mounting bar.
FIG. 7 is a view looking in the direction of the arrows 7—7 of FIG. 6 but showing the parts mounted on a printed circuit board.

As is apparent from FIG. 7, the lower edge 84 of the substrate 52 is not supported by the spring receptacle but is rather supported by the ends 86 of the grooves 58 and the flanges 56. As with the previous embodiment, suitable feet 82 maintain the mounting bar above the surface of the printed circuit board 53.

When the embodiment of FIG. 4 is put to use, the substrate 52 is assembled to the mounting and connecting device 50 and the post portions 64 are then inserted through the holes in the printed circuit board. The lower ends of the post are then soldered to the conductors on the board. In either embodiment, soldering may be delayed until the substrate is tested.

Both embodiments of the invention provide a low cost means for mounting substrates on printed circuit boards and permit low cost assembly of the substrates to the boards without the need for welding individual leads to the substrates. The overall dimensions of a substrate in combination with a mounting and connecting means in accordance with the invention are only slightly greater than the dimensions of the substrate by itself so that good packaging density can be achieved in accordance with the invention.

What is claimed is:

1. Mounting and connecting means for mounting a substrate on a printed circuit board and for connecting the terminal pads on said substrate to the conductors on said printed circuit board, said mounting and connecting means comprising:

an elongated carrier bar, said carrier bar being of a relatively firm plastic insulating material, a plurality of electrical connecting devices, said devices being secured intermediate their ends to two opposite edges of said carrier bar and each of said devices having a spring receptacle on one end thereof and a post portion on the other end thereof, said spring receptacles being spaced from and on one side of said carrier bar and said post portions being spaced from and on the other side thereof, said spring receptacle of each of said devices comprising a reversely bent end portion formed as a circular spring having an open gap for reception of said substrate, said devices being offset on said opposite edges of said carrier bar and said spring receptacles being in alignment with each other whereby, said connecting devices can be electrically connected to conductors on said printed circuit board by inserting said post portions through holes in said board said soldering said post portions to said conductors, and upon insertion of said substrate into said spring receptacles, said pads are connected to said connecting devices and said conductors.

2. Mounting and connecting means as set forth in claim 1 wherein said carrier bar has flanges at each end thereof, said flanges having grooves therein for reception of edge portions of said substrate.

3. Mounting and connecting means as set forth in claim 2 wherein said grooves have inner ends for supporting said substrate with said pads in said spring receptacles.

* * * * *